(12) United States Patent  
Iwasaki

(10) Patent No.: US 7,965,022 B2
(45) Date of Patent: Jun. 21, 2011

(54) PIEZOELECTRIC ELEMENT

(75) Inventor: Tomio Iwasaki, Tsukuba (JP)

(73) Assignee: Hitachi, Ltd., Tokyo (JP)

( * ) Notice: Subject to any disclaimer, the term of this patent is extended or adjusted under 35 U.S.C. 154(b) by 59 days.

(21) Appl. No.: 12/582,723

(22) Filed: Oct. 21, 2009

(65) Prior Publication Data

US 2010/0102680 A1   Apr. 29, 2010

(30) Foreign Application Priority Data

Oct. 22, 2008   (JP) ................................. 2008-271679

(51) Int. Cl.
*H01L 41/047* (2006.01)
*H01L 41/083* (2006.01)
(52) U.S. Cl. ........................................ 310/363; 310/366
(58) Field of Classification Search .................. 310/363, 310/366
See application file for complete search history.

(56) References Cited

U.S. PATENT DOCUMENTS

| 7,431,811 B2 * | 10/2008 | Chou et al. ..................... 204/291 |
| 2003/0100146 A1 * | 5/2003 | Nakano et al. ................ 438/118 |
| 2010/0123177 A1 * | 5/2010 | Ozaki ........................... 257/295 |

FOREIGN PATENT DOCUMENTS

| JP | 04-167580 | | 6/1992 |
| JP | 7-088370 A | * | 4/1995 |
| JP | 2000-150977 | | 5/2000 |
| JP | 2003-188673 A | * | 7/2003 |
| JP | 2004-231500 | | 8/2004 |

* cited by examiner

*Primary Examiner* — Thomas M Dougherty
(74) *Attorney, Agent, or Firm* — Antonelli, Terry, Stout & Kraus, LLP.

(57) ABSTRACT

A piezoelectric element that is high in piezoelectric performance and large in displacement and is reliable is provided. The piezoelectric element includes a piezoelectric material containing $BaTi_2O_5$ as the principal constituent material and an inner electrode that applies voltage to the piezoelectric material. In this piezoelectric element, an electrode material (a mixture of Ru and $RuO_2$) excellent in lattice matching with the piezoelectric material $BaTi_2O_5$ is used as the principal constituent material of the inner electrode.

10 Claims, 3 Drawing Sheets

PIEZOELECTRIC ELEMENT

CLAIM OF PRIORITY

The present application claims priority from Japanese patent application serial No. 2008-271679 filed on Oct. 22, 2008, the content of which is hereby incorporated by reference into this application

BACKGROUND OF THE INVENTION

1. Field of the Invention

The present invention relates to a piezoelectric element used in actuators and the like for injectors that are used for applicators for adhesive, coating agents, or the like, inkjet devices, fuel injection systems for internal combustion engines, and the like and are capable of accurate, high-speed discharge.

2. Description of the Related Art

Piezoelectric elements are widely used in various industrial fields and various elements have been conventionally developed to the respective applications. As a conventional technology related to a piezoelectric element that can achieve a relatively large displacement (stroke), the following piezoelectric element is disclosed in JP-A-H4-167580: a piezoelectric element obtained by stacking multiple subunits of such an inner electrode structure that a piezoelectric inactive portion is provided.

There is also the piezoelectric element described in JP-A-2000-150977. This is a piezoelectric element obtained by joining together multiple chip blocks, formed by laminating multiple piezoelectric element chips each having a piezoelectric material and an inner electrode, with a joining layer in-between. In this piezoelectric element, the inner electrode is so formed as to cover a cross section of the piezoelectric material perpendicular to the direction of lamination and an electrical insulation layer is provided at an end of the inner electrode exposed from a side face of the piezoelectric element.

In recent years, however, materials not only satisfy the large discharge displacement but also impose less load in terms of environment have been required and a nonleaded material is sought for in place of lead zirconate titanate (PZT) that has been conventionally used as a piezoelectric material.

As a nonleaded piezoelectric material, for example, $BaTi_2O_5$ described in JP-A-2004-231500 is considered to be promising. However, it turned out that $BaTi_2O_5$ solely does not deliver sufficient piezoelectric performance and cannot achieve a large displacement.

The present inventors found that the following took place in a piezoelectric element having a piezoelectric material containing $BaTi_2O_5$ as the principal constituent material and a voltage application electrode. That is platinum and silver-palladium conventionally used for electrodes are inferior in lattice matching with $BaTi_2O_5$ as a piezoelectric material, and sufficient piezoelectric performance or reliability cannot be obtained because the atomic arrangement is disturbed in the interface between them. In these piezoelectric elements, a sufficient displacement cannot be obtained in the piezoelectric material when voltage is applied and the displacement is reduced with time.

It is an object of the invention to provide a novel piezoelectric element that is high in piezoelectric performance, and makes it possible to obtain a sufficient displacement and is reliable.

SUMMARY OF THE INVENTION

The present inventors found that the displacement of the piezoelectric element can be dramatically increased and the performance and reliability of the piezoelectric element can be enhanced by using as the electrode material a mixture of Ru and $RuO_2$ excellent in lattice matching with $BaTi_2O_5$ as the principal constituent material of the piezoelectric material.

The invention is characterized in that: a piezoelectric element is obtained by laminating multiple piezoelectric element chips each having a piezoelectric material containing $BaTi_2O_5$ as the principal constituent material and an inner electrode that applies voltage to this piezoelectric material to construct a piezoelectric element chip block; and joining the multiple piezoelectric element chip blocks together with a joining layer in-between. The inner electrode is so formed as to cover a cross section of the piezoelectric material perpendicular to the direction of lamination. There are provided an electrical insulation layer provided on the inner electrode exposed from one side face of the piezoelectric element and an external electrode connected with the inner electrode exposed from the other side face of the piezoelectric element. The principal constituent material of the inner electrode is a mixture of Ru and $RuO_2$.

The invention is characterized in that $BaTi_2O_5$ as the principal constituent material of the piezoelectric material is a mixture of $BaTiO_3$ and $TiO_2$. The invention is characterized in that the composition ratio of $BaTiO_3$ and $TiO_2$ and the composition ratio of Ru and $RuO_2$ as the principal constituent materials of the inner electrode are substantially 1:1.

The invention is characterized in that the piezoelectric material contains crystal grains of the rutile structure and $RuO_2$ in the inner electrode has a crystal of the rutile structure. A cross section of the piezoelectric material perpendicular to the direction of lamination and the Ru (001) plane and the $RuO_2$ (001) plane in the inner electrode are substantially parallel to each other. The crystal grains of the rutile structure in the piezoelectric material contain $TiO_2$.

Further, The invention is characterized in that the piezoelectric material contains crystal grains of the anatase structure and $RuO_2$ in the inner electrode has a crystal of the anatase structure. A cross section of the piezoelectric material perpendicular to the direction of lamination and the Ru (001) plane and the $RuO_2$ (001) in the inner electrode are substantially parallel to each other. The crystal grains of the anatase structure in the piezoelectric material contain $TiO_2$.

In addition, The invention is characterized in that an inner electrode is provided between a joining layer and the piezoelectric material and an electrical insulation layer is provided on one side of the joining layer and the inner electrode. The inner electrode and the external electrode are electrically joined with each other on the other side where the electrical insulation layer does not exist.

In addition, The invention is characterized in that a conductive material is used for the joining layer.

The invention makes it possible to dramatically increase the displacement of the piezoelectric element and enhance the performance and reliability of the piezoelectric element by taking the following measure: a mixture of Ru and $RuO_2$ excellent in lattice matching with $BaTi_2O_5$ as the principal constituent material of the piezoelectric material is used as the principal constituent material of the inner electrode.

DETAILED DESCRIPTION OF THE PREFERRED EMBODIMENTS

In the following description, each embodiment will be divided into multiple sections or embodiments if necessary for the sake of convenience. Unless explicitly stated otherwise, they are in such a relation that one is a modification, details, supplementary explanation, or the like of part or all of the other.

When mention is made of any number of elements (including a number of pieces, a numeric value, a quantity, a range, and the like) in the following description of embodiments, the number is not limited to that specific number. Unless explicitly stated otherwise or the number is obviously limited to a specific number in principle, the foregoing applies.

In the following description of embodiments, needless to add, their constituent elements (including elemental steps and the like) are not always indispensable to the invention unless explicitly stated otherwise or they are obviously indispensable in principle.

Similarly, when mention is made of the shape, positional relation, or the like of a constituent element or the like in the following description of embodiments, it includes those substantially approximate or analogous to that shape or the like. This applies unless explicitly stated otherwise or it is apparent in principle that some shape or the like does not include those substantially approximate or analogous to that shape or the like. This is the same with the above-mentioned numeric values and ranges.

First Embodiment

Figure 1:
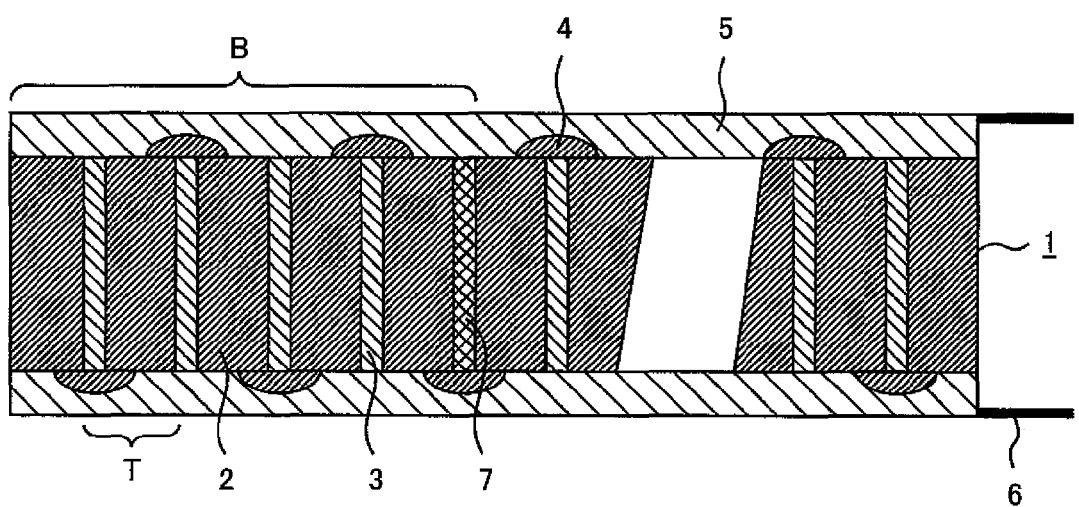
FIG. 1 is a longitudinal sectional view illustrating the basic structure of a piezoelectric element in a first embodiment of the invention.

Hereafter, description will be given to embodiments of the invention with reference to the drawings. FIG. 1 illustrates a first embodiment of the invention. In the piezoelectric element 1, a pair of inner electrodes 3 are so formed as to cover the entire surface of the piezoelectric material 2 containing $BaTi_2O_5$ as the principal constituent material perpendicular to the direction of lamination. A piezoelectric element chip T is thereby obtained.

The principal constituent material in this embodiment refers to a material contained 50% or above in the entire components and each component must be contained 50% or above in the entire components to obtain the effect of the invention.

$BaTi_2O_5$ is composed of a mixture of barium titanate, $BaTiO_3$ and titanium oxide, $TiO_2$ and the piezoelectric element delivers the highest performance when their composition ratio is 1:1. However, composition ratios other than 1:1, for example, a composition ratio of 0.7:1.0 can obtain sufficient piezoelectric performance that can be used in the invention.

To cause piezoelectric action, the piezoelectric element chip T is so structured that the piezoelectric material 1 is sandwiched between a pair of the inner electrodes 3. The inner electrode 3 contains a mixture of Ru and $RuO_2$, materials excellent in lattice matching with $BaTi_2O_5$ as the principal constituent material. The performance of the piezoelectric element is highest when the composition ratio of Ru and $RuO_2$ is 1:1. Similarly with the piezoelectric material, composition ratios other 1:1 can also obtain sufficient piezoelectric performance that can be used in the invention.

$BaTiO_3$ has a hexagonal lattice crystal structure and its atomic arrangement in the interface between the piezoelectric material 2 and the inner electrode 3 is in a regular stable state for Ru similarly having a hexagonal lattice crystal structure. The hexagonal lattice crystal structure has a dense interatomic arrangement and is high in interatomic attractive force and produces a large displacement depending on an applied electric field. It is stable against temporal degradation in piezoelectric performance caused as it is repeatedly used.

The inner electrode 3 only has to cover the piezoelectric material 2 to the extent that piezoelectric action is substantially uniformly caused at the cross sections of the semiconductor chip.

The piezoelectric element 1 in this embodiment is obtained by: laminating multiple piezoelectric element chips T each comprised of a piezoelectric material 2 and an inner electrode 3 to construct a piezoelectric element chip block B; and joining two piezoelectric element chip blocks B together by a joining layer 7. In one piezoelectric element chip block B, an inner electrode 3 is shared by adjoining piezoelectric chips.

In the embodiment in FIG. 1, three piezoelectric element chips are formed in one piezoelectric element chip block B and the outermost piezoelectric materials 2 of the piezoelectric element chip block B do not have piezoelectric action.

An electrical insulation layer 4 is provided at an end of each inner electrode 3 for insulation from an external electrode 5. In the embodiment in FIG. 1, the electrical insulation layer 4 is alternately formed between an inner electrode 3 and the upper external electrode 5 and between an inner electrode 3 and the lower external electrode 5. The inner electrodes 3 and the external electrodes 5 are electrically joined with each other in the other areas in the peripheries of the inner electrodes 3 where the electrical insulation layer 4 does not exist and further each external electrode 5 is provided with a lead wire 6.

Figure 2:
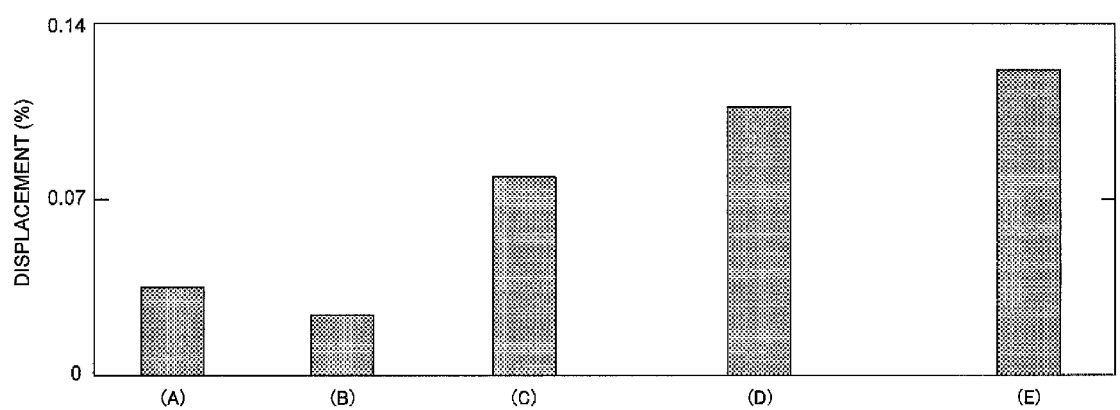
FIG. 2 is a graph indicating displacements in first to third embodiments of the invention in comparison with a conventional example.

FIG. 2 indicates the maximum displacement in various combinations of the piezoelectric material and the inner electrode. In the first embodiment, as shown in (c) of FIG. 2, in the combination of the piezoelectric material made of $BaTiO_5$ and the inner electrode made of the mixture of Ru and $RuO_2$ with random arrangement, the maximum displacement of the piezoelectric element reaches 0.07% or so. Further, the maximum displacement of the combination of the piezoelectric material made of $BaTiO_5$ and the inner electrode made of Platinum is shown in (A), and the maximum displacement of the combination of the piezoelectric material made of $BaTiO_5$ and the inner electrode made of Silver-Palladium alloy is shown in (B) of FIG. 2.

The following can be seen from FIG. 2: the maximum displacement of a piezoelectric element can be dramatically increased by using a mixture of Ru and $RuO_2$ as the inner electrode in place of platinum or silver-palladium alloys conventionally used for the inner electrode.

Second Embodiment

Subsequently, a piezoelectric element in which the following is implemented was constructed: $BaTi_2O_5$ containing $TiO_2$ as crystal grains of the anatase structure is used as the piezoelectric material and $RuO_2$ having a crystal of the anatase structure is used as $RuO_2$ in the inner electrode; and a cross section of the piezoelectric material perpendicular to the direction of lamination and the Ru (001) plane and the RuO$_2$ (001) plane in the inner electrode are substantially parallel to each other.

In this case, the lattice matching at the interface between the piezoelectric material and the inner electrode is further enhanced. As shown illustrated in (D) of FIG. 2, the maximum displacement is increased more than in combinations of a piezoelectric material and an inner electrode having random orientation in the first embodiment.

Third embodiment

Further, a piezoelectric element in which the following is implemented was constructed: BaTi$_2$O$_5$ containing TiO$_2$ as crystal grains of the rutile structure is used as the piezoelectric material and RuO$_2$ having a crystal of the rutile structure is used as RuO$_2$ in the inner electrode; and a cross section of the piezoelectric material perpendicular to the direction of lamination and the Ru (001) plane and the RuO$_2$ (001) plane in the inner electrode are parallel to each other.

In this case, the lattice matching in the interface between the piezoelectric material and the inner electrode become highest as shown indicated in (E) of FIG. 2 and the maximum displacement was larger than in the first and second embodiments.

The above-mentioned anatase crystal structure has a quasi-stable crystal structure obtained by the rutile crystal structure being slightly twisted.

Fourth Embodiment

Figure 3:
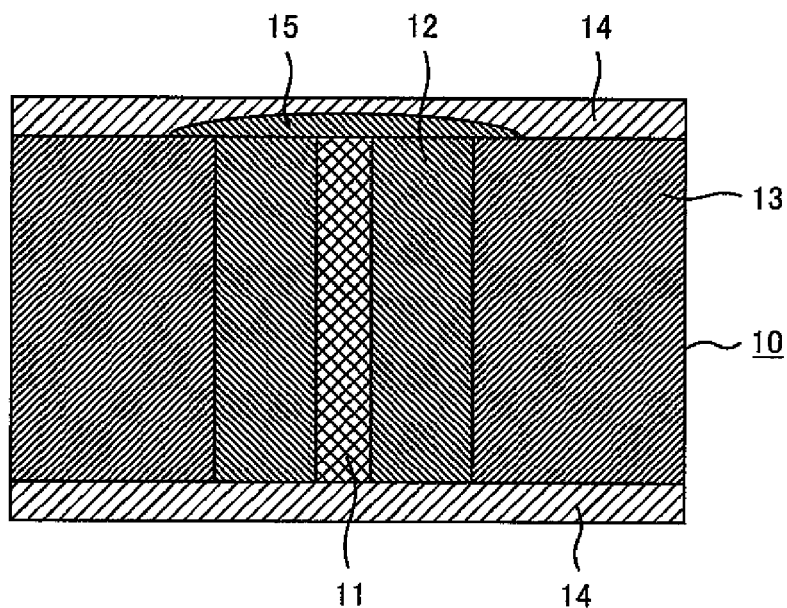
FIG. 3 is a longitudinal sectional view illustrating the structure of a piezoelectric element in a fourth embodiment of the invention.

FIG. 3 illustrates a fourth embodiment of the invention. This is a piezoelectric element 10 in which the following is implemented: an inner electrode 12 is also provided between a joining layer 11 and a piezoelectric material 13; an electrical insulation layer 15 is provided at an end of the joining layer 11; and the inner electrode 12 and an external electrode 14 are electrically joined with each other at the other end where the electrical insulation layer 15 does not exist.

In case of this embodiment, an electric field can also be formed in the piezoelectric material 13 adjoining to the joining layer 11; therefore, a displacement further larger than in the element in FIG. 1 can be obtained when their lengths are identical.

Fifth Embodiment

Figure 4:
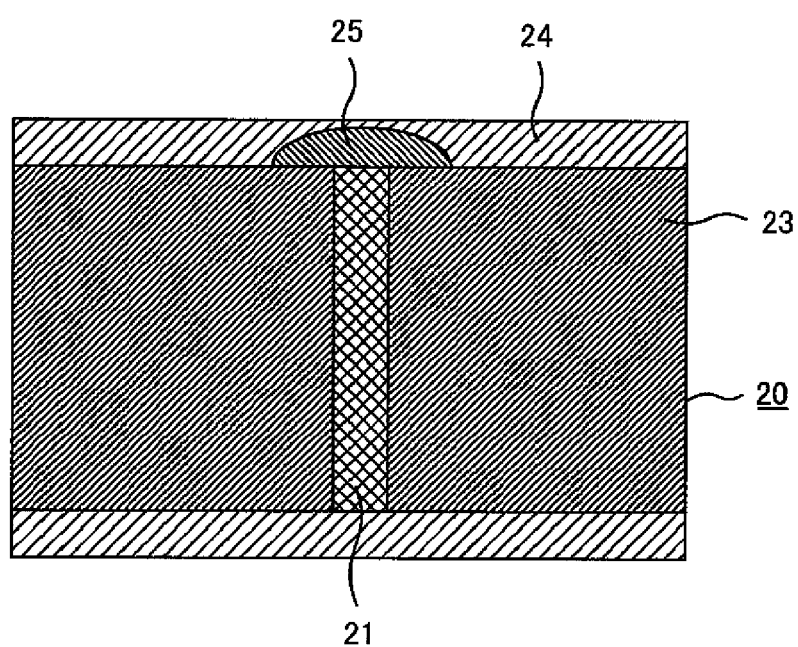
FIG. 4 is a longitudinal sectional view illustrating the structure of a piezoelectric element in a fifth embodiment of the invention.

FIG. 4 illustrates a fifth embodiment of the invention. This is a piezoelectric element 20 in which the following is implemented: a joining layer 21 is formed of a conductive material composed of, for example, conductive adhesive or the like; piezoelectric materials 23 are joined together with the joining layer 21 in-between; and an electrical insulation layer 25 and external electrodes 24 are formed. Also in this case, a piezoelectric inactive portion can be reduced as in the fourth embodiment and thus a large displacement can be obtained as in the fourth embodiment.

Up to this point, concrete description has been given to the invention made by the present inventors based on embodiments. However, the invention is not limited to the above embodiments and can be variously modified without departing from the subject matter of the invention, needless to add.

What is claimed is:

1. A piezoelectric element obtained by laminating a plurality of piezoelectric element chips each having a piezoelectric material containing BaTi$_2$O$_5$ as the principal constituent material and an inner electrode applying voltage to the piezoelectric material to construct a piezoelectric element chip block and joining the plurality of piezoelectric element chip blocks together with a joining layer in-between, wherein the inner electrode is so formed as to cover a cross section of the piezoelectric material perpendicular to the direction of lamination, the piezoelectric element comprising an electrical insulation layer provided on the inner electrode exposed from one side face of the piezoelectric element and an external electrode connected with the inner electrode exposed from the other side face of the piezoelectric element, and wherein the principal constituent material of the inner electrode is a mixture of Ru and RuO$_2$.

2. The piezoelectric element according to claim 1,
wherein BaTi$_2$O$_5$ as the principal constituent material of the piezoelectric material is a mixture of BaTiO$_3$ and TiO$_2$.

3. The piezoelectric element according to claim 2,
wherein the composition ratio of BaTiO$_3$ and TiO$_2$ is substantially 1:1.

4. The piezoelectric element according to claim 3,
wherein the composition ratio of Ru and RuO$_2$ as the principal constituent materials of the inner electrode is substantially 1:1.

5. The piezoelectric element according to claim 4,
wherein the piezoelectric material contains crystal grains of the rutile structure and RuO$_2$ in the inner electrode has a crystal of the rutile structure and a cross section of the piezoelectric material perpendicular to the direction of lamination and the Ru (001) plane and the RuO$_2$ (001) plane in the inner electrode are substantially parallel to each other.

6. The piezoelectric element according to claim 5,
wherein the crystal grains of the rutile structure in the piezoelectric material contain TiO$_2$.

7. The piezoelectric element according to claim 4,
wherein the piezoelectric material contains crystal grains of the anatase structure, RuO$_2$ in the inner electrode has a crystal of the anatase structure, and a cross section of the piezoelectric material perpendicular to the direction of lamination and the Ru (001) plane and the RuO$_2$ (001) plane in the inner electrode are substantially parallel to each other.

8. The piezoelectric element according to claim 7,
wherein the crystal grains of the anatase structure in the piezoelectric material contain TiO$_2$.

9. The piezoelectric element according to claim 4,
wherein an inner electrode is provided between the joining layer and the piezoelectric material, an electrical insulation layer is provided on one side of the joining layer and the inner electrode, and the inner electrode and the external electrode are electrically joined with each other on the other side where the electrical insulation layer does not exist.

10. The piezoelectric element according to claim 4,
wherein a conductive material is used for the joining layer, an electrical insulation layer is provided on one side of the joining layer, and the joining layer and an external electrode are electrically joined with each other on the other side where the electrical insulation layer does not exist.

* * * * *